United States Patent
Chen et al.

(10) Patent No.: US 8,044,473 B2
(45) Date of Patent: Oct. 25, 2011

(54) LIGHT SENSOR

(75) Inventors: Chi-wen Chen, Hsin-Chu (TW); Meng-hsiang Chang, Hsin-Chu (TW)

(73) Assignee: AU Optronics Corp., Hsin-Chu (TW)

( * ) Notice: Subject to any disclaimer, the term of this patent is extended or adjusted under 35 U.S.C. 154(b) by 473 days.

(21) Appl. No.: 11/972,056

(22) Filed: Jan. 10, 2008

(65) Prior Publication Data

US 2009/0085036 A1 Apr. 2, 2009

(30) Foreign Application Priority Data

Sep. 28, 2007 (TW) ................................ 96136219 A

(51) Int. Cl.
*H01L 27/14* (2006.01)
(52) U.S. Cl. .................. 257/431; 257/E27.13
(58) Field of Classification Search .................. 257/431, 257/E27.13
See application file for complete search history.

(56) References Cited

U.S. PATENT DOCUMENTS

| | | | | |
|---|---|---|---|---|
| 5,027,177 | A * | 6/1991 | Vasudev | 257/290 |
| 5,488,000 | A | 1/1996 | Zhang et al. | |
| 2004/0043676 | A1 | 3/2004 | Tada et al. | |
| 2005/0156261 | A1 | 7/2005 | Nishikawa et al. | |
| 2005/0285167 | A1 | 12/2005 | Mouli et al. | |
| 2006/0138421 | A1 * | 6/2006 | Tada | 257/59 |

* cited by examiner

*Primary Examiner* — Colleen Matthews
(74) *Attorney, Agent, or Firm* — Kirton & McConkie; Evan R. Witt

(57) ABSTRACT

A light sensor includes an intrinsic layer, a first ion doping area disposed one side of the intrinsic layer, a second ion doping area disposed at the other side of the intrinsic layer, an oxide insulating layer on the intrinsic layer, and a gate metal on the oxide insulating layer. The first and second ion doping areas have the same P type or N type doped ions. The intrinsic layer further includes a first light sensing region close to the first ion doping area. The first light sensing region is used for generating electron-hole pairs based on luminance of incident light.

13 Claims, 7 Drawing Sheets

| Lux / Vg | Dark | 10 | 250 | 500 | 1700 |
|---|---|---|---|---|---|
| -2V | 1 | 2 | 24 | 55 | 160 |
| 2V | 1 | 1 | 1.56 | 1.87 | 2.47 |

FIG. 5

LIGHT SENSOR

BACKGROUND OF THE INVENTION

1. Field of the Invention

The present invention relates to a light sensor and its manufacture method, and more particularly, to a light sensor and its manufacture method without using a CMOS process.

2. Description of Prior Art

More and more advanced-function displays have found their applications in current consumer electronic products. In particular, liquid crystal displays (LCDs) having a high-resolution color screen, are more widely applied in various electronic devices, such as televisions, mobile phones, personal digital assistances (PDA), digital cameras, desktop computer screens, and notebook computer screens.

To facilitate portability and usage of these devices, touch-control LCDs with an LCD touch panel to allow direct touch by the users have become the trend in the LCD market. Conventional resistor type or capacitor type LCD touch panels, which are configured by disposing additional resistors or capacitors on the panels, determine the coordinate positions of touch-points by detecting the voltage variation at the touch positions. However, since the resistors and capacitors are directly disposed on the panels, light transmittance through the LCD panel will be decreased and the overall thickness of the LCD panel will be increased. Another type of LCD touch panel, called an optical touch panel, is configured by disposing a large amount of light sources and corresponding optical detecting elements around an LCD panel. The coordinate position of a touch-point is determined when determining the position of an optical detecting element has failed to receive light rays from a corresponding light source. Although this design would not decrease the overall light transmittance through the panel, the product size is significantly increased. Accordingly, a touch-control LCD with detecting elements incorporated into a touch panel thereof is desirable to decrease the weight and volume of the LCD and thus meets the compact demand of the LCD market.

Referring to FIG. 1, which shows a conventional light sensor, the light sensor diode 10 is a P-I-N diode which contains a P-type area 12 doped with P-type dopants, an intrinsic layer 14 and an N-type area 16 doped with N-type dopants. The function of the intrinsic layer 14 is to increment a thickness of PN depletion region, so as to increase possibility of attracting photons and to reduce junction capacitor. The light sensor diode 10 induces electrical potential or photocurrent in accordance with incident light. When light is incident to the light sensor diode 10 and no bias voltage applied on the light sensor diode 10, electron-hole pairs are generated in the intrinsic layer 14 to increase a number of carriers, inducing photocurrent through the light sensor diode 10. When reverse bias voltage applied on the light sensor diode 10 (which means that the P-type area is coupled to a negative electrode of a power while the N-type is coupled to a positive electrode of the power), a reverse photoelectrical current is generated in proportion to luminance.

Traditionally, the intrinsic layer 14 is manufactured by poly-Si process. However, in contrast to amorphous silicon (a-Si) process, the intrinsic layer 14 manufactured by poly-Si has a lower sensitivity in sensing visible light. As a result, it is desirable to develop a new light sensor.

SUMMERY OF THE INVENTION

Therefore, the present invention provides a light sensor capable of reducing manufacture processes and having better light sensitivity.

According to the present invention, a light sensor comprises an intrinsic layer comprising a first light sensing region and a channel, a first ion doping area disposed at a first side of the intrinsic layer, a second ion doping area disposed at a second side of the intrinsic layer opposite to the first side, an oxide insulating layer disposed on the intrinsic layer, and a gate metal disposed on the oxide insulating layer. The first light sensing region adjacent to the first ion doping area is used for generating electron-hole pairs in response to luminance of incident light;

According to the present invention, a method of manufacturing a light sensor, comprises the steps of: forming a poly crystalline silicon thin film; ion-implanting the poly crystalline silicon thin film by using a first mask to form a first ion doping area and a second ion doping area; depositing an oxide insulating film on the poly crystalline silicon thin film; depositing a metal film on the oxide insulating film; and etching the oxide insulating film and the metal film by using a second mask to form an oxide insulating layer and a gate metal, so that areas of the oxide insulating layer and the gate metal are smaller than that of the poly crystalline silicon thin film without ion-implanting.

The present invention will be described with reference to the accompanying drawings, which show exemplary embodiments of the present invention.

BRIEF DESCRIPTION OF THE DRAWINGS

FIG. 5 is a characteristic diagram showing a ratio between the photocurrent and dark current with a width of a first sensing region being 2 µm, under various luminance and voltage Vg applied on the gate metal.

DETAILED DESCRIPTION OF THE INVENTION

Figure 1:
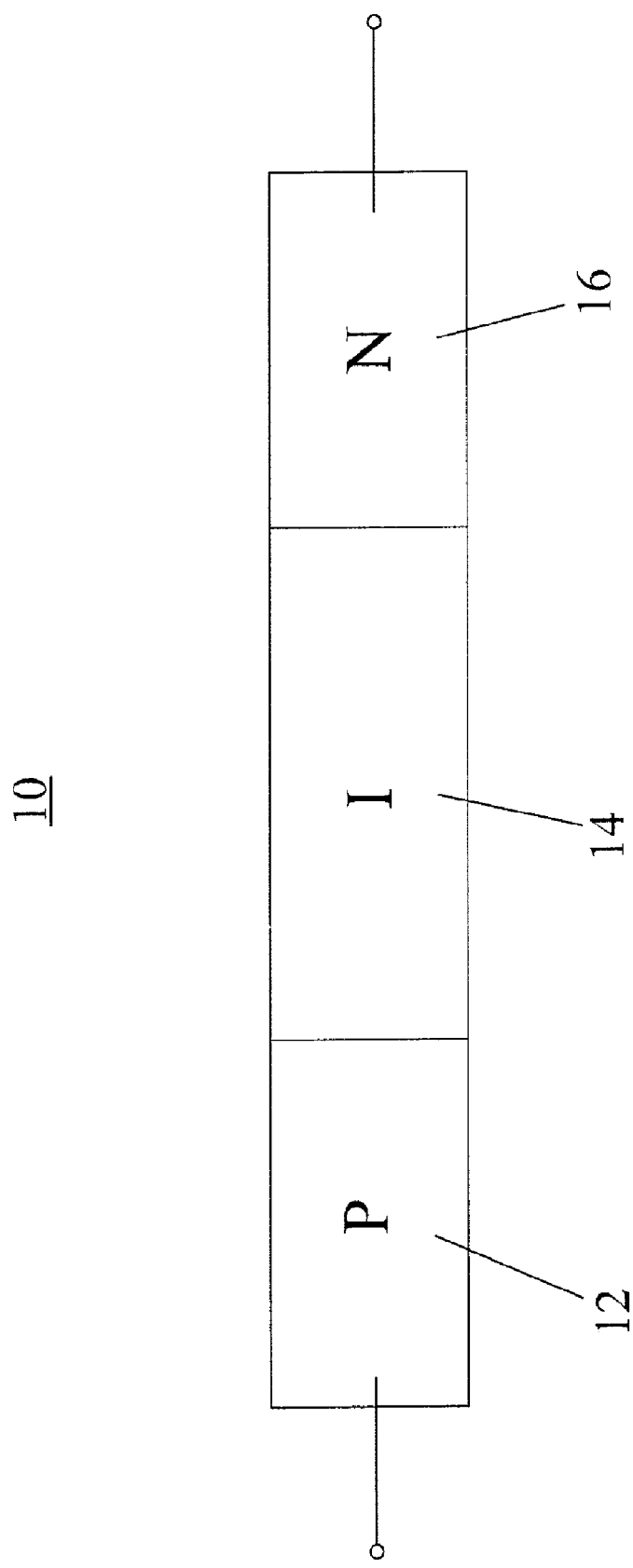
FIG. 1 shows a conventional light sensor.
Figure 2:
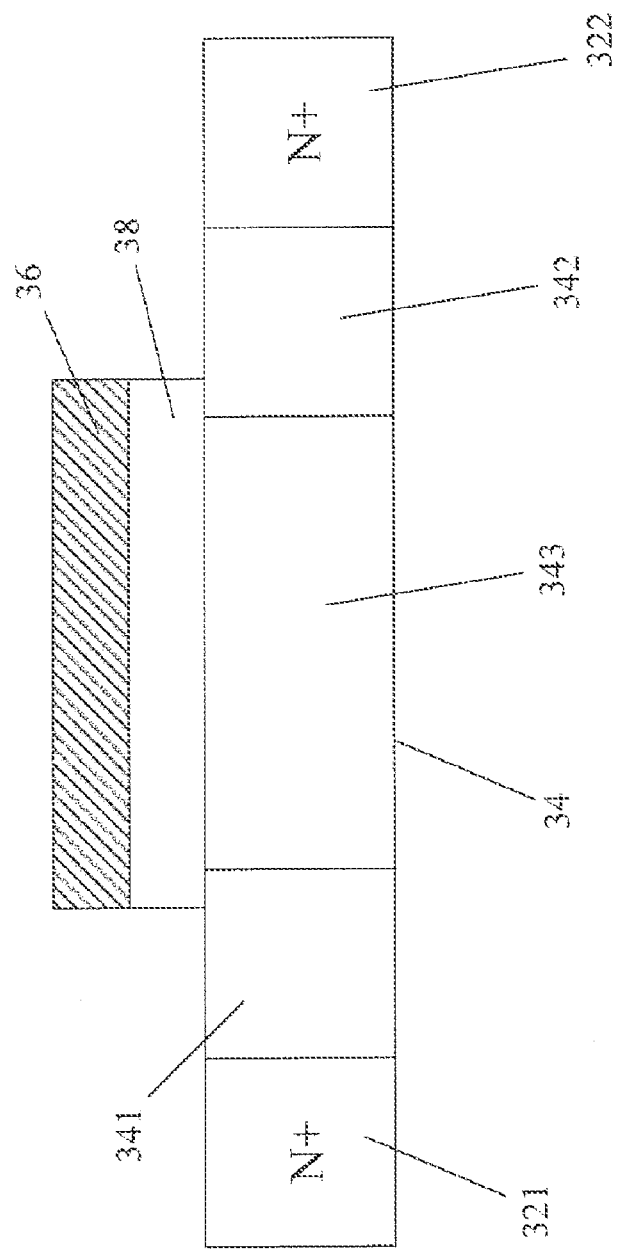
FIG. 2 depicts a light sensor according to a first embodiment of the present invention.

FIG. 2 depicts a light sensor according to a first embodiment of the present invention. The light sensor 30 comprises a first ion doping area 321, a second ion doping area 322, an intrinsic layer 34, an oxide insulating layer 38, and a metal film 36 which is a gate. The intrinsic layer 34 is positioned between the second ion doping area 322 and the first ion doping area 321. Doping ions in the first ion doping area 321, e.g. P-type ions or N-type ions, are similar to that in the second doping area 322. Preferably, both ion densities of the first ion doping area 321 and the second ion doping area 322 substantially equals to $10^{18}$ atoms/cm$^3$. The oxide insulating layer 38 is positioned on the intrinsic layer 34, and the metal film gate 36 overlaps the oxide insulating layer 38. In this embodiment, the intrinsic layer 34 further comprises a first light sensing region 341 adjacent to the first ion doping area 321, a second light sensing region 342 adjacent to the second ion doping area 322, and a channel 343. The intrinsic layer 34, the first ion doping area 321, and the second ion doping area 322 are made of poly crystalline silicon. Preferably, ion density of the poly crystalline silicon is substantially in a range between $10^{11}$ to $10^{14}$ atoms/cm$^3$. In this embodiment, an area of the metal film gate 36 and the oxide insulating layer 38 overlapping the intrinsic layer 34 is smaller than areas of the channel 343 and the first light sensing region 341. As shown in FIG. 2, an area of the metal film gate 36 and oxide insulating layer 38 overlapping the first light sensing region 341 is smaller than an area of the first light sensing region 341 which is not overlapped by the metal film gate 36 and oxide insulating layer 38. Similarly, an area of the metal film gate 36 and oxide insulating layer 38 overlapping the second light sensing region 342 is smaller than an area of the second light sensing region 342 which is not overlapped by the metal film gate 36 and oxide insulating layer 38.

Figure 3:
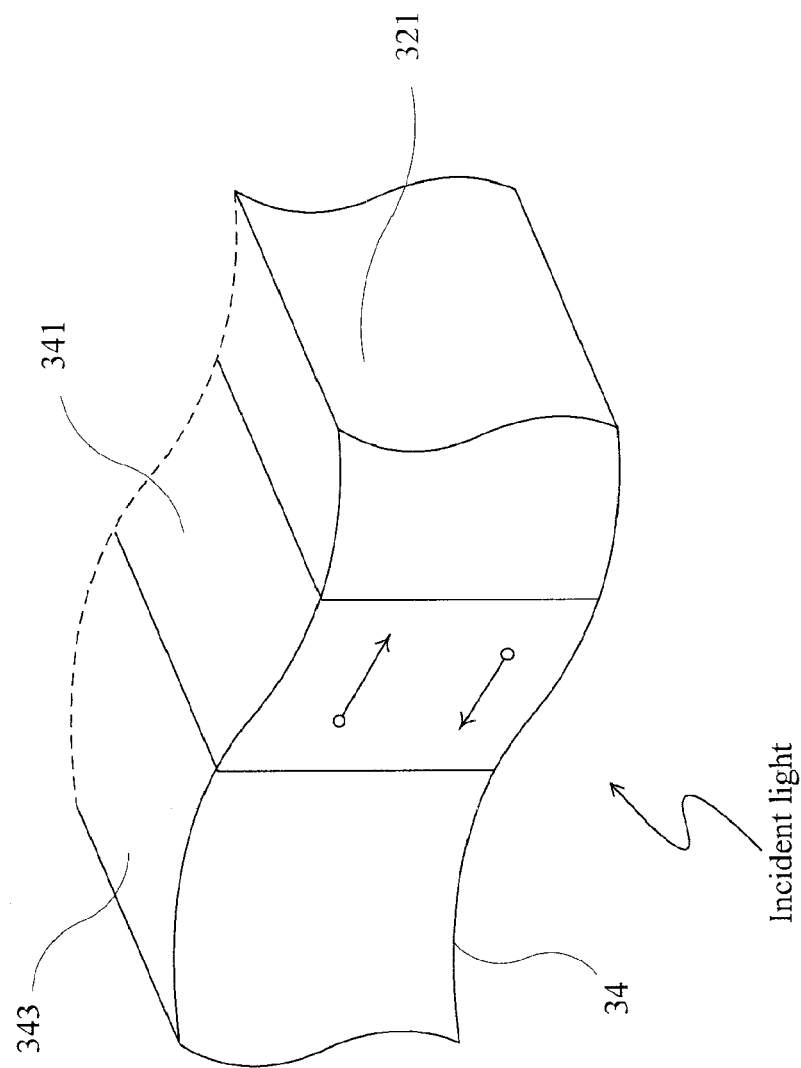
FIG. 3 illustrates a schematic diagram of photocurrent generated in the light sensor.
Figure 4:
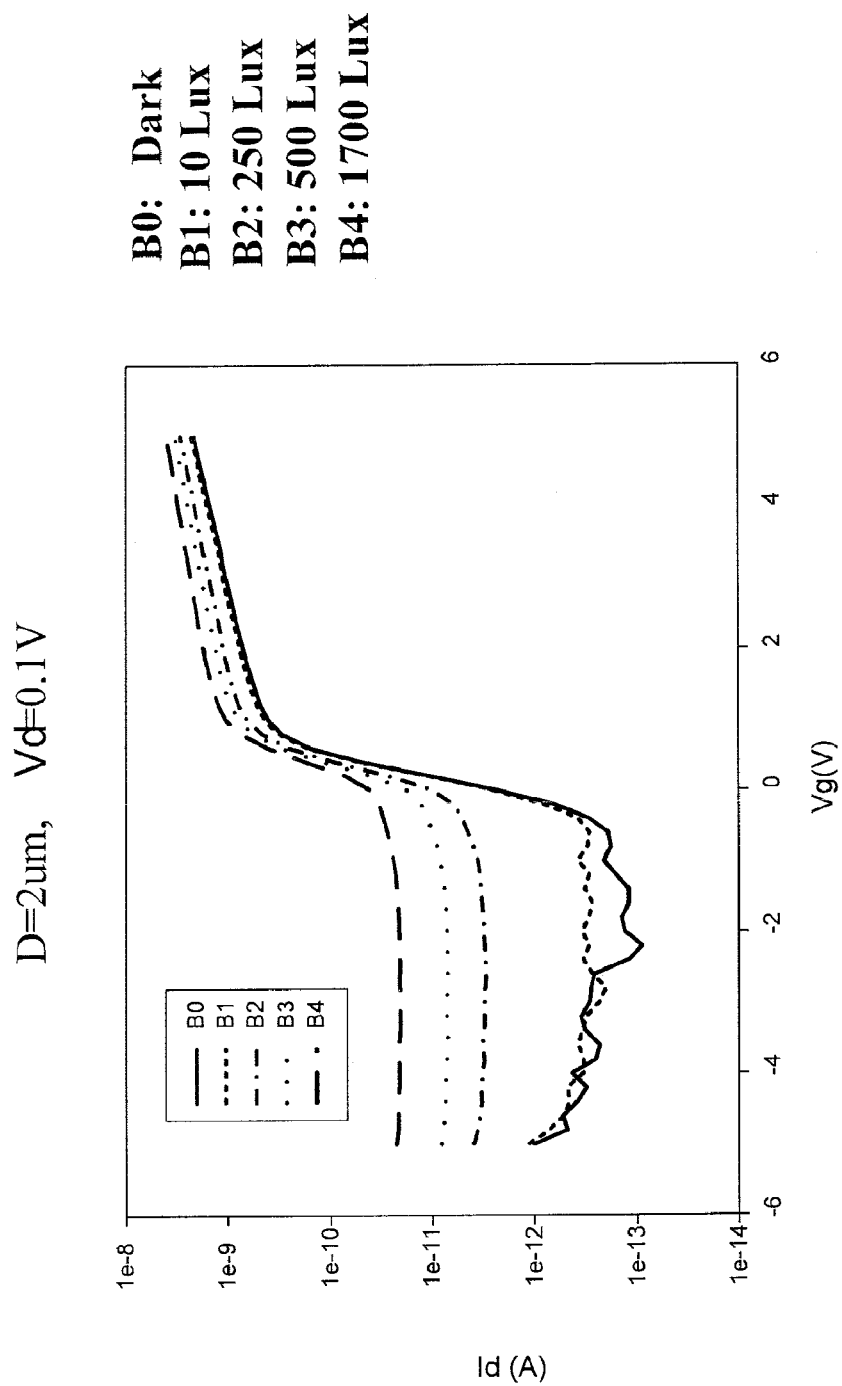
FIG. 4 is a characteristic diagram showing a relationship between photocurrent Id and voltage Vg applied on the gate metal, when a various amount light incident to the light sensing region.

Referring to FIGS. 3, 4, and 5, FIG. 3 illustrates a schematic diagram of photocurrent generated in the light sensor. FIG. 4 is a characteristic diagram showing a relationship between photocurrent Id and voltage Vg applied on the gate metal, when the light sensing region 341 is illuminated with various luminances. FIG. 5 is a characteristic diagram showing a ratio between the photocurrent and dark current with a width of a first sensing region 341 being 2 μm, under various luminance and voltage Vg applied on the gate metal. Electron-hole pairs are induced by incident light to the first light sensing region 341. When the first ion doping area 321 coupled to 0.1V, the second ion doping area 322 is coupled to ground, and the gate metal 36 is applied to voltage Vg of −2V, with reference to FIGS. 4 and 5, the sensed photocurrent Id rapidly increments as a increase in luminance of light. For example, when light of 10 Lux is incident to the first light sensing region 341, the photocurrent Id is as approximately 2 times as dark current in indicative of generated current with no incident light. When light of 1700 Lux is incident to the first light sensing region 341, the photocurrent Id is as approximately 160 times as dark current.

When the first ion doping area 321 coupled to 0.1V, the second ion doping area 322 is coupled to ground, and the gate metal 36 is applied to voltage Vg of 2V, with reference to FIGS. 4 and 5, the sensed photocurrent Id slightly increments as a increase in luminance of light. For example, when light of 10 Lux is incident to the first light sensing region 341, the photocurrent Id is almost the same as dark current. When light of 1700 Lux is incident to the first light sensing region 341, the photocurrent Id is as 2.47 times as dark current. As a result, the light sensor of the present invention has well light sensitivity.

Figure 6:
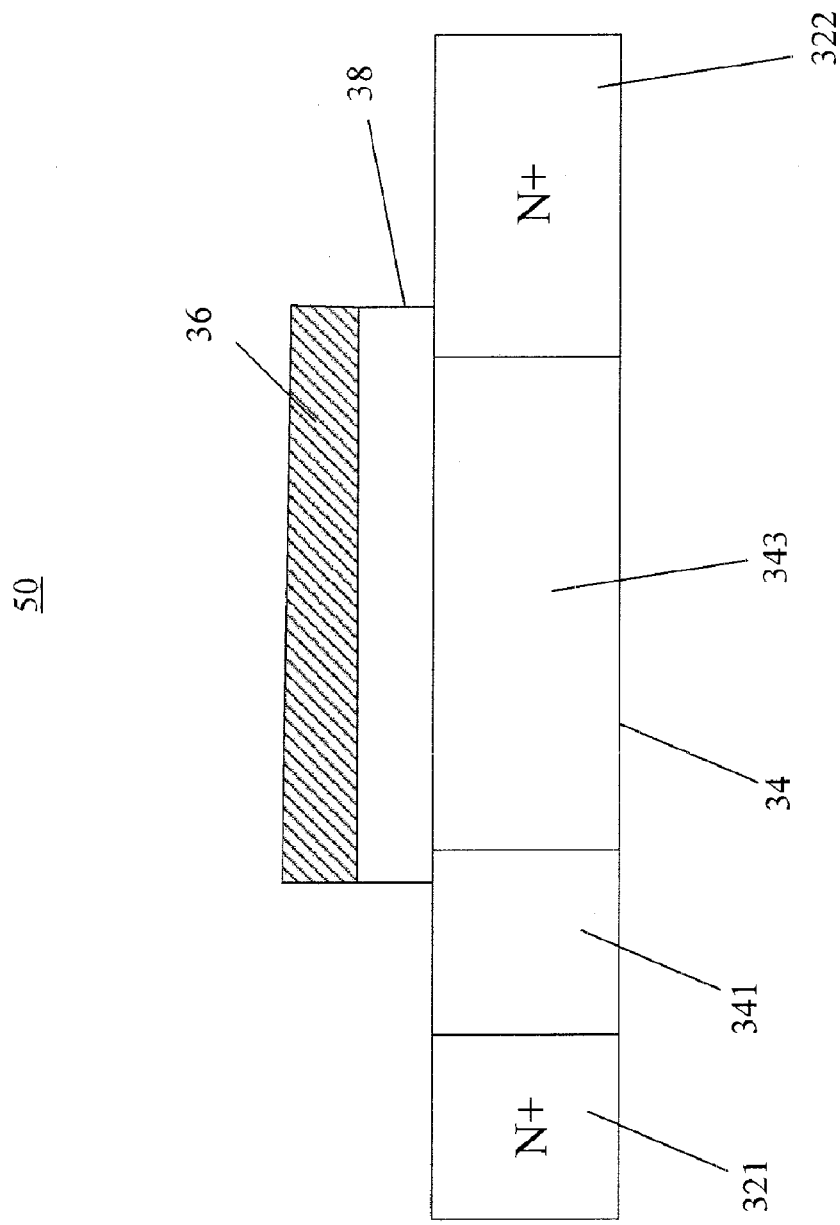
FIG. 6 shows a light sensor according to a second embodiment of the present invention.

Referring to FIG. 6, which shows a light sensor according to a second embodiment of the present invention, the light sensor 50 has only one light sensing region 341 close to the first ion doping area 321.(second ion doping area 322).

Figure 7:
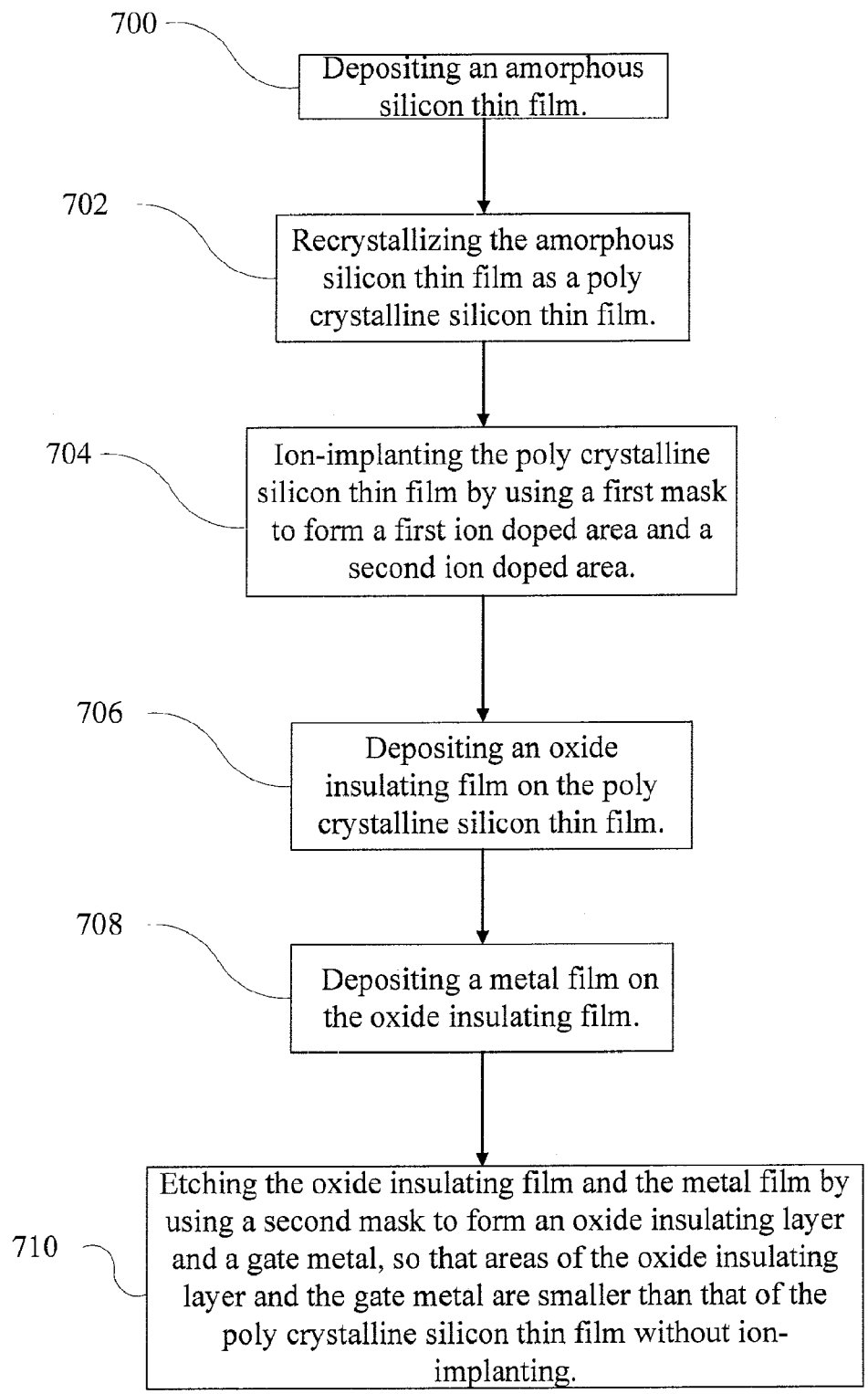
FIG. 7 illustrates a flowchart of a method for manufacturing the light sensor shown in FIG. 2.

FIG. 7 illustrates a flowchart of a method for manufacturing the light sensor shown in FIG. 2. The method comprises the steps as follows:

Step 700: Depositing an amorphous silicon thin film.
Step 702: Recrystallizing the amorphous silicon thin film as a poly crystalline silicon thin film.
Step 704: Ion-implanting the poly crystalline silicon thin film by using a first mask to form a first ion doping area and a second ion doping area. It should be noted that the implanted ions in the first ion doping area and the second ion doping area are P-type (or N-type) ions.
Step 706: Depositing an oxide insulating film on the poly crystalline silicon thin film.
Step 708: Depositing a metal film on the oxide insulating film.
Step 710: Etching the oxide insulating film and the metal film by using a second mask to form an oxide insulating layer and a metal film gate, so that areas of the oxide insulating layer and the metal film gate are smaller than that of the poly crystalline silicon thin film without ion-implanting.

In contrast to prior art, the light sensor according to the present invention is formed by utilizing only one ion-implanting step (Step 704) without using complex CMOS processes, thereby reducing cost for CMOS processes and keeping well light sensitivity.

While the present invention has been described in connection with what is considered the most practical and preferred embodiments, it is understood that this invention is not limited to the disclosed embodiments but is intended to cover various arrangements made without departing from the scope of the broadest interpretation of the appended claims.

What is claimed is:

1. A light sensor comprising:
   an intrinsic layer comprising a first light sensing region, a second light sensing region, and a channel;
   a first ion doping area disposed at a first side of the intrinsic layer;
   a second ion doping area disposed at a second side of the intrinsic layer opposite to the first side, wherein the first light sensing region adjacent to the first ion doping area and the second light sensing region disposed adjacent to the second ion doping area are used for generating electron-hole pairs in response to luminance of incident light;
   an oxide insulating layer disposed on the intrinsic layer, wherein the oxide insulating layer overlaps the intrinsic layer; and
   a metal film disposed on the oxide insulating layer, wherein the metal film is a gate, wherein an area of the metal film gate and oxide insulating layer overlapping the first light sensing region is smaller than an area of the first light sensing region which is not overlapped by the metal film gate and oxide insulating layer and wherein an area of the metal film gate and oxide insulating layer overlapping the second light sensing region is smaller than an area of the second light sensing region which is not overlapped by the metal film gate and oxide insulating layer.

2. The light sensor of claim 1, wherein the ions in the first ion doping area and the second ion doping area are P-type dopants.

3. The light sensor of claim 1, wherein the ions in the first ion doping area and the second ion doping area are N-type dopants.

4. The light sensor of claim 1, wherein the intrinsic layer and the first ion doping area are made of poly crystalline silicon.

5. The light sensor of claim 1, wherein an area of the metal film gate and the oxide insulating layer overlapping the intrinsic layer is smaller than areas of the channel and the first light sensing region.

6. The light sensor of claim 1, wherein the type of the doped ions in the first ion doping area are the same as the type of the doped ions in the second ion doping area.

7. The light sensor of claim 6, wherein the individual ion density of the first ion doping area and the second ion doping area substantially equals to $10^{18}$ atoms/cm$^3$.

8. A light sensor comprising:
   an intrinsic layer comprising a first light sensing region and a channel;
   a first ion doping area disposed at a one side of the intrinsic layer;
   a second ion doping area disposed at a another side of the intrinsic layer, wherein the first light sensing region adjacent to the first ion doping area is used for generating electron-hole pairs in response to luminance of incident light;

an insulating layer disposed on the intrinsic layer; and a metal film overlapping the channel, wherein the metal film is a gate, wherein an area of the metal film gate overlapping the first light sensing region is smaller than an area of the first light sensing region which is not overlapped by the metal film gate.

9. The light sensor of claim 8, wherein the type of the doped ions in the first ion doping area are substantially identical to the type of the doped ions in the second doped area.

10. The light sensor of claim 8, wherein the intrinsic layer and the first ion doping area are made of poly crystalline silicon.

11. The light sensor of claim 8, wherein the metal film gate covers a part of the first light sensing area and a part of the second light sensing area.

12. The light sensor of claim 8, wherein the intrinsic layer further comprising a second light sensing region disposed between the channel and the second ion doping area.

13. The light sensor of claim 12, wherein an area of the metal film gate overlapping the second light sensing region is smaller than an area of the second light sensing region which is not overlapped by the metal film gate.

* * * * *